United States Patent [19]

Moon

[11] Patent Number: 5,679,597
[45] Date of Patent: Oct. 21, 1997

[54] METHOD FOR MANUFACTURING CCD IMAGE PICKUP DEVICE

[75] Inventor: Shang-Ho Moon, Cheongju, Rep. of Korea

[73] Assignee: LG Semicon Co., Ltd., Chungcheongbuk-do, Rep. of Korea

[21] Appl. No.: 660,340

[22] Filed: Jun. 21, 1996

[30] Foreign Application Priority Data

Jun. 22, 1995 [KR] Rep. of Korea ............... 1995/16867

[51] Int. Cl.$^6$ ............................................. H01L 21/339
[52] U.S. Cl. ................................. 437/53; 437/3; 437/50
[58] Field of Search ........................ 437/2, 3, 50, 53, 437/238, 240

[56] References Cited

U.S. PATENT DOCUMENTS

| | | | |
|---|---|---|---|
| 4,859,624 | 8/1989 | Goto | 437/53 |
| 5,202,282 | 4/1993 | Son | 437/53 |
| 5,246,875 | 9/1993 | Shinji et al. | 437/53 |
| 5,422,285 | 6/1995 | Ishibe | 437/3 |
| 5,567,632 | 10/1996 | Nakashiba et al. | 437/53 |

Primary Examiner—Chandra Chaudhari
Attorney, Agent, or Firm—Morgan, Lewis and Bockius LLP

[57] ABSTRACT

A method for manufacturing a CCD (charge coupled device) image pickup device includes (1) forming a P well and a field oxide layer upon an N type substrate, forming a buried CCD channel, and a photo diode; (2) forming a gate insulating layer and gate electrodes for a VCCD and an HCCD, and covering the electrodes with a cap gate insulating layer; (3) forming an etch stop layer on the cap gate insulating layer, removing a portion of the etch stop layer to form a contact hole, depositing a first insulating layer, and etching the layer and the cap layer to expose the gate electrode; (4) depositing and patterning to form a metal wiring connected to the gate electrode; (5) forming an inter-layer insulating layer on the metal wiring and the first insulating layer; (6) forming a photoresist mask for covering a peripheral circuit portion and an HCCD portion and wet-etching the inter-layer insulating layer and the first insulating layer by using the photoresist mask to open a light receiving portion; and (7) depositing a light shielding metal layer, removing the layer above a photo diode of a light receiving portion, wherein at the step (5), an etch speed for the inter-layer insulating layer is made to be faster than that for the first insulating layer, resulting a surface etch speed to be faster than an etch speed at a boundary of the first insulating layer, causing a boundary of the inter-layer insulating layer to have a positive slope after the wet-etching.

12 Claims, 6 Drawing Sheets

METHOD FOR MANUFACTURING CCD IMAGE PICKUP DEVICE

BACKGROUND OF THE INVENTION

1. Field of the Invention

The present invention relates to a method for manufacturing a CCD (charge coupled device) image pickup device, and more particularly, to a method for manufacturing a CCD image pickup device which uses a light shielding film.

2. Description of the Related Art

Figure 1:
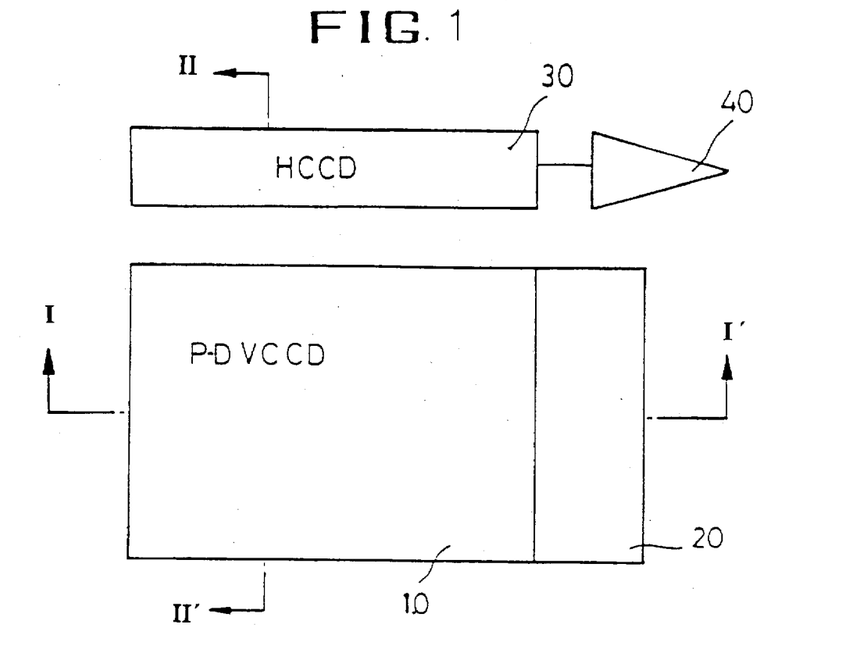
FIG. 1 is a plan view of a general CCD image pickup device.
Figure 2:
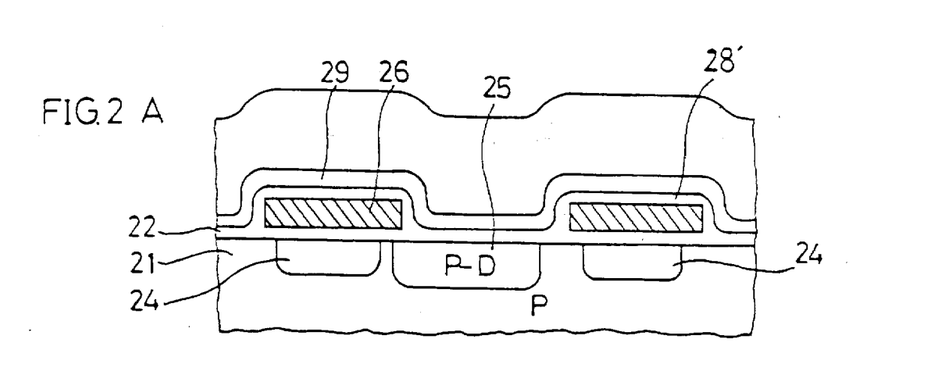
FIGS. 2A, 3A, 4A, 5A and 6A are sectional views taken along a line I—I' of FIG. 1, showing a part of the pixel portion.
FIGS. 2B, 3B, 4B and 5B are sectional views taken along the line I—I', showing a part of a peripheral circuit.

Generally, a CCD image pickup device has a layout as show in FIG. 1. It usually includes a light receiving portion 10, a peripheral circuit 20, a horizontal CCD (HCCD) 30, and an amplifying section 40. The light receiving portion 10 consists of a plurality of photo diodes and a plurality of vetical CCD (VCCD). The peripheral circuit 20 supplies control signals to the gates of the VCCD with proper timing, and supplies and receives other control signals. The horizontal CCD (HCCD) 30 receives video signals from the VCCD in parallel to transmit the video signals in series. The amplifying section 40 amplifies the output signals of the HCCD.

A conventional method for manufacturing the CCD image pickup device will now be described referring to the attached drawings.

FIGS. 2A, 3A, 4A, 5A and 6A are partial sectional views taken along a line I—I' of FIG. 1 showing parts of the pixel portions. FIGS. 2B, 3B, 4B and 5B are sectional views taken along the line I—I' of FIG. 1 showing the peripheral circuit area. FIGS. 5C and 6B are sectional views taken along the line H—H' of FIG. 1 showing a boundary portion between the VCCD and the HCCD.

As shown in FIGS. 2A and 2B, a P type well 21 and a field oxide layer 23 are formed on an N type substrate (not shown). A buried CCD channel 24 (i.e., VCCD and HCCD) is then formed. At the same time, a photo diode (P-D) 25 is formed.

Next, a gate insulating layer 22 (mainly composed of oxides) is deposited. Polysilicon is deposited on the entire surface. A patterning is then carried out, thereby forming a first gate electrode 26 for the CCD. In order to insulate the gate electrode 26 from the upper and side portions, a first insulating layer 28 is deposited.

As shown in FIGS. 5C and 6B, polysilicon is then deposited on the entire surface. A patterning is carded out to form a second gate electrode 26'. More specifically, the process is as the following. Polysilicon is deposited and a patterning is carded out by applying a photo etching process to form the first gate electrode 26. Then, the first insulating layer 28 is formed to cover the first gate electrode 26. The second gate electrode 26' is then formed and a second insulating layer 28' is deposited. Then, a process such as a low temperature chemical vapor deposition method is applied to form a high density insulating layer 29 (by using a silicon nitride film).

In order to connect the gate electrode 26 to a metal wiring line at the peripheral circuit 20, as shown in FIG. 2B, a first photo process is applied using a photo resist layer 30 to define a contact portion, and then, the insulating layer 29 is etched to form a contact hole portion.

Figure 3A:
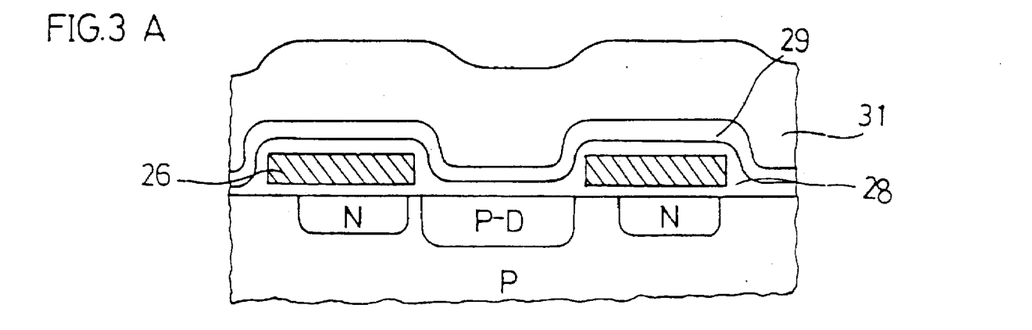
Figure 3B:
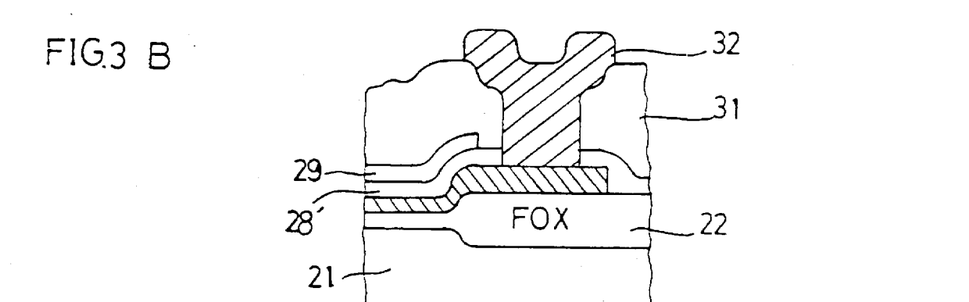

As show in FIGS. 3A and 3B, the photoresist layer 30 is removed. A thick insulating layer 31 is formed on the entire surface by using an LTD (low temperature oxide), an HLD (high pressure low temperature dielectric), TEOS-USG (tetra-ethyl-ortho-silicate updoped silica glass), or BPSG (Coorophosphosilicate glass). Then, a photo etching process is applied to completely etch the contact hole portion, thereby forming a contact hole. A metal is deposited in the contact hole and a patterning is carried out, thereby forming a metal wiring layer 32 which is connected to the gate electrode 26.

Figure 4:
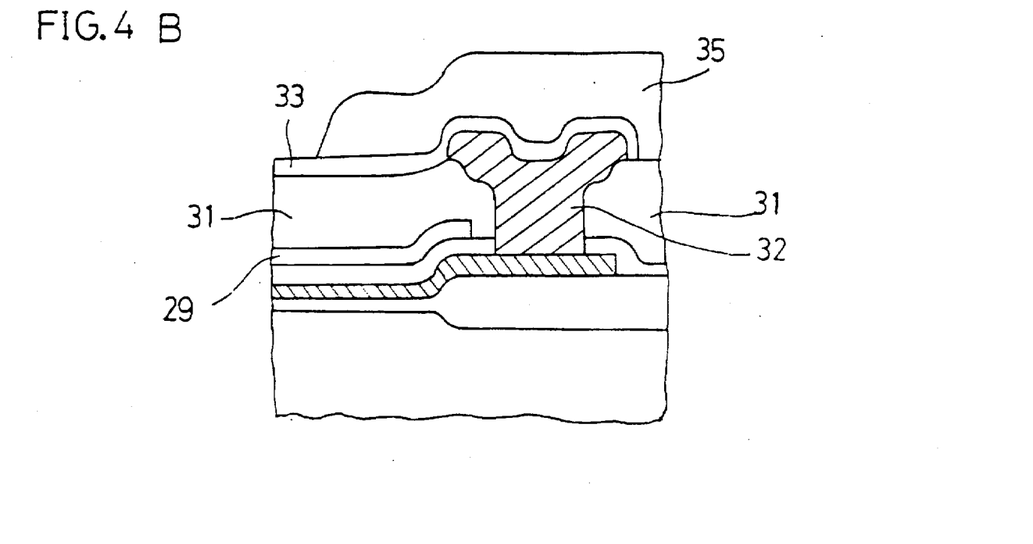
Figure 4A:
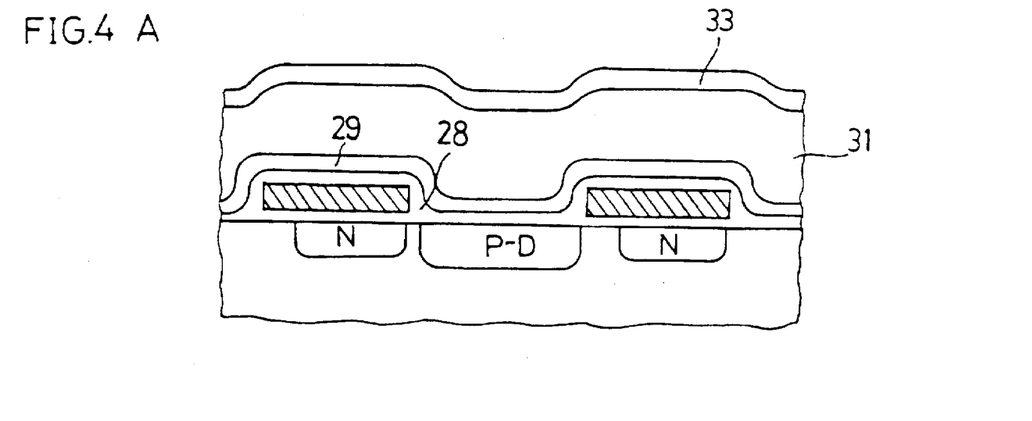

As shown in FIGS. 4A and 4B, an inter-layer insulating layer 33 is deposited for insulating the metal wiring layer 32. Then, in order to expose the photo diode which is in the light receiving portion 10, a second photo process is applied to form a photoresist mask 35 for the purpose of removing the inter-layer insulating layer 33 and the insulating layer 31.

Figure 5:
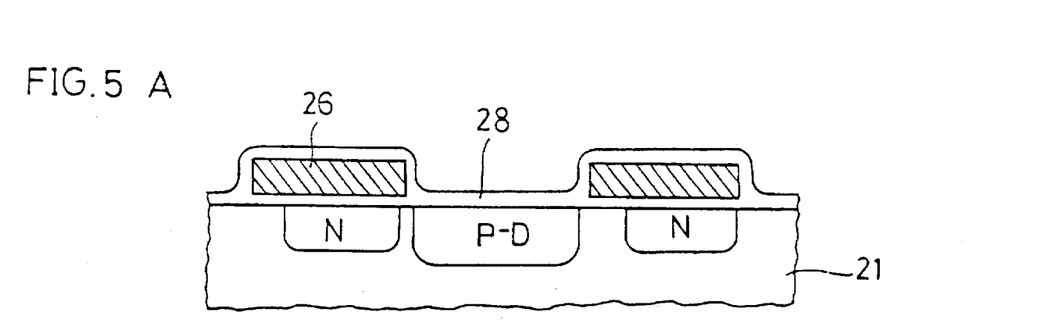
FIGS. 5C and 6B are sectional views taken along a line II—II' of FIG. 1, showing a part of a boundary between a VCCD and an HCCD.
Figure 5C:
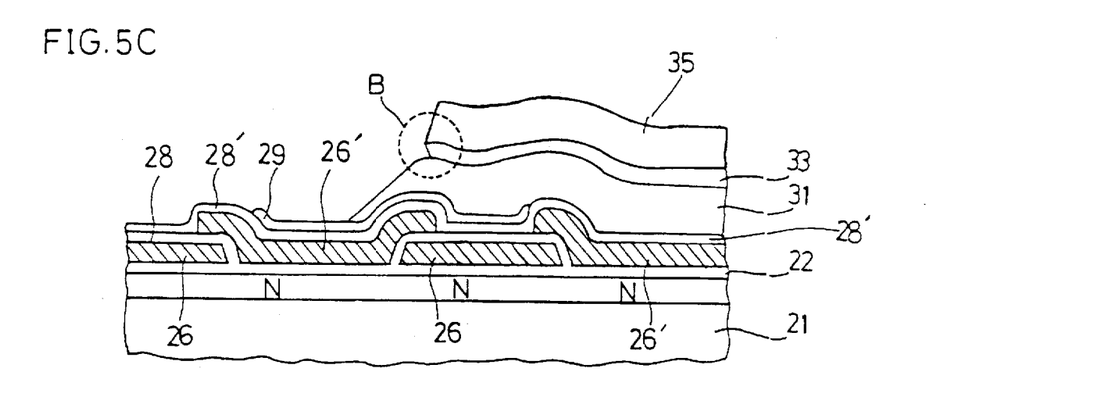

As shown in FIGS. 5A and 5B, by utilizing the photoresist mask 35 as a mask, a wet etching is carded out to remove the inter-layer insulating layer 33 and the insulating layer 31 in the light receiving portion 10. During this wet etching process, the high density insulating layer 29 formed of a silicon nitride layer serves as an etch stop layer to protect the oxide insulating layer 28 and the gate electrode 26 which are disposed thereunder. When the wet etching is carried out by using a BOE (buffered oxide etchant), the high density insulating layer 29 has a sufficient density to prevent the intrusion of the etchant, thereby protecting the device. Next, the insulating layer 29 is removed by using a wet etching process or a chemical dry etching process (CDE) in such a manner so that the damage to the light receiving portion should be minimal.

FIG. 5C shows a part of the cross section of the boundary between the HCCD and the VCCD in a state when the above described processes are finished. Upon the gates 26' of the HCCD, there is the photoresist mask 35 so that the high density insulating layer 29 and the insulating layer 31 are protected from being etched. As shown in regions "A" and "B" in FIGS. 5B and 5C, during the wet etching, the insulating layer 31 is etched with a sufficient etch selectivity ratio between the high density insulating layer 29 and the inter-layer insulating layer 33, so that the boundary between the insulating layer 31 and the inter-layer insulating layer 33 is more rapidly etched. As a result, the inter-layer insulating layer 33 has a negative slope at the boundary.

Figure 6A:
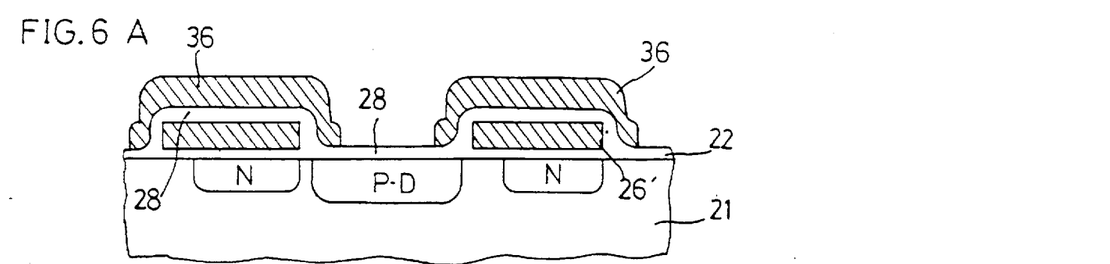
Figure 6B:
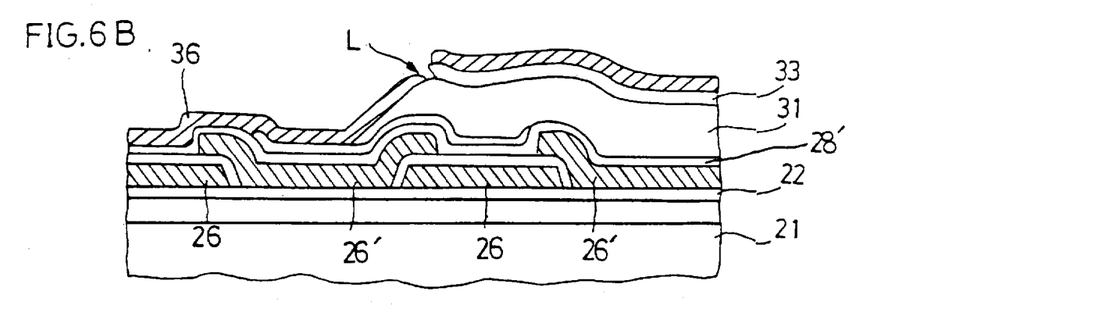

Then, after removing the photoresist mask 35, as shown in FIGS. 6A and 6B, a light shielding metal layer is deposited and then selectively removed from the light receiving portion 10 to allow the light rays pass through to the photo diodes, thereby forming a light shielding layer 36 above other areas. As a result, the HCCD portion and the VCCD portion of the light receiving portion are left with the unetched light shielding metal layer, so that light rays would be completely shielded. In this light shielding layer 36 thus formed, there is a metal layer discontinuity at the portion "B" of the boundary between the HCCD and the BCCD owing to the negative slope of the inter-layer insulating layer 33 (FIGS. 5C and 6B).

In this image pickup device manufactured in the above described manner, the insulating layers 31 and 29 in the VCCD of the light receiving portion 10 are removed. Only the light shielding metal layer 36 and the insulating layer 28 remain. Consequently, the stepped difference becomes minimal and the structure becomes effective for preventing the smear phenomenon.

However, the insulating layer 31 and the inter-layer insulating layer 33 have to remain in the area around the metal wiring layer 32 of the peripheral circuit 20 and in the HCCD-VCCD boundary. More specifically, when the patterning is carried out by means of the photoresist in the first and second photo processes, a certain gap has to be maintained between the contact hole and the gate of the CCD, considering the side etch effect during the wet etching. Therefore, it is safer to set margin positions for the first photo process and the second photo process on the HCCD-VCCD boundary where the pixel portion and the HCCD are connected together.

The light shielding metal layer 36 is not formed on the portion where the metal wiring layer 32 is formed. Therefore, as shown in the portion "A" of FIG. 5B, the negative slope between the inter-layer insulating layer 33 and the oxide layer 31 is not problematic. Accordingly, the pixel portion (VCCD portion) achieves an efficient light shielding through the first and second photo processes.

However, cracks are formed or a gap is formed in the light shielding metal layer 36, as shown in FIG. 6B, due to the negative slope between the insulating layer 31 and the inter-layer insulating layer 33 in the portion "B" of the HCCD-VCCD boundary (FIG. 5C). Therefore, the light shielding fails, and light rays L (FIG. 6B) intrude through the cracks or the gap. The intruded light rays become noise charges when the signals charges are transmitted from VCCD to HCCD.

SUMMARY OF THE INVENTION

Accordingly, the present invention is directed to a method for manufacturing a CCD image pickup device that substantially obviates one or more of the problems due to limitations and disadvantages of the related art.

An object of the present invention is to provide a method for manufacturing a CCD image pickup device with reduced noise.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method for manufacturing a CCD image pickup device of the present invention includes the steps of forming a structure having a photo diode, a buried CCD channel, and gate electrodes for a vertical CCD (VCCD) and a horizontal CCD (HCCD); forming a high density insulating layer and a first insulating layer on the structure, the high density insulating layer and the first insulating layer have a contact hole exposing the gate electrode of the VCCD; forming a metal wiring in the contact hole for connecting with the gate electrode of the VCCD; forming an inter-layer insulating layer on the first insulating layer and the metal wiring layer, the etch speed of the inter-layer insulating layer being faster than that of the fist insulating layer; wet etching the inter-layer insulating layer and the first insulating layer by using a mask covering the HCCD and a portion around the metal wiring, thereby forming a light receiving portion, a boundary of the inter-layer insulating layer having a positive slope; and forming a light shielding metal layer on the structure except above the photo diode.

In another aspect, a method for manufacturing a CCD image pickup device of the present invention includes the steps of (1) forming a P well and a field oxide layer upon an N type substrate, forming a buried CCD channel, and forming a photo diode (P-D); (2) forming a gate insulating layer, forming gate electrodes for a VCCD and an HCCD, and covering the gate electrodes with a cap gate insulating layer; (3) forming a silicon nitride layer as an etch stop layer on the resulting surface, removing a portion of the silicon nitride layer corresponding to a contact portion to form a contact hole, depositing a first insulating layer, and etching the first insulating layer and the cap gate insulating layer to completely open the contact hole for connecting the gate electrode to a metal wiring to be formed; (4) depositing a metal, carrying out a patterning to form a metal wiring, the metal wiring being connected to the gate electrode; (5) forming an inter-layer insulating layer for insulating the metal wiring from a light shielding metal layer; (6) forming a photoresist mask for covering a peripheral circuit portion and an HCCD portion by applying a photo process, and wet-etching the inter-layer insulating layer and the first insulating layer by using the photoresist mask as a mask, so as to completely open a light receiving portion; and (7) depositing a light shielding metal layer, removing the metal layer corresponding to a light receiving portion of a photo diode to make light rays pass through, and leaving the metal layer for the remaining portions to shield light rays, so as to form a light shielding layer, wherein at the step (5), an etch speed for the inter-layer insulating layer is made to be faster than that for the first insulating layer, and thus, a surface etch speed is made to be faster than an etch speed of a boundary of the first insulating layer, thereby forming a positive slope.

The first insulating layer may be formed by a BPSG Coorophosphosilicate glass), and the inter-layer insulating layer by a PSG (phosphosilicate glass).

The inter-layer insulating layer may be formed by depositing a PSG at a temperature of about 400° C. by applying a PECVD (plasma enhanced chemical vapor deposition) process, and then, in order to make the surface etch speed faster than the etch speed of the boundary of the BPSG, P ions are ion-implanted. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invemion, examples of which are illustrated in the accompanying drawings.

In carrying out the process of the present invention, the process steps of FIG. 2A through FIG. 4B are first applied.

In other words, a P well 21 and a field oxide layer 23 are formed upon ann type substrate. A buried CCD channel 24 and a photo diode (P-D) 25 are then formed.

A gate insulating layer 22 is then formed. Next, gate electrodes 26 and 26' for a VCCD and an HCCD are formed by depositing polysilicon. Insulating layers 28 and 28' are then formed.

Then, a high density insulating layer 29 in the form of a silicon nitride layer is formed as a etch stop layer. A contact hole portion is formed by selectively removing the high density insulating layer 29 in the contact portion. Next, a first thick insulating layer 31 is deposited by using an LTD (low temperature oxide), an HLD (high pressure low temperature dielectric), a TEOS-USG (tetra ethyl ortho-silicate undoped silica glass), BPSG or PSG. Then a contact hole is completely opened by etching the insulating layer 31, thereby exposing the gate electrode 26. A metal is deposited in the contact hole, and a patterning is carried out to form a metal wiring layer 32 which is connected to the gate electrode 26.

Figure 7:
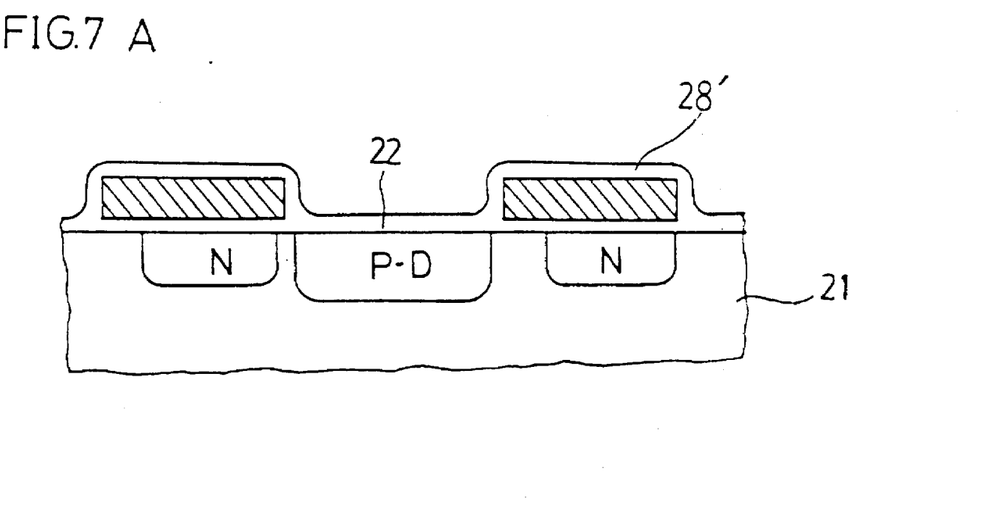
FIG. 7A and 8A are sectional views taken along the line I—I' of FIG. 1, showing a part of the pixel according to the present invention.
FIG. 7B is a sectional view taken along the line I—I' of FIG. 1, showing a part of the peripheral circuit according to the present invention.
FIGS. 7C and 8B are sectional views taken along the line II—II' of FIG. 1, showing a part of the boundary between the VCCD and the HCCD according to the present invention.
Figure 7C:
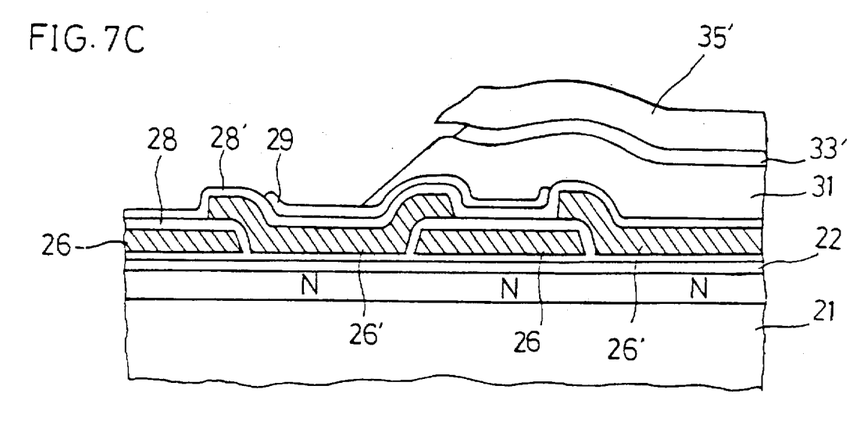

As shown in FIGS. 7A to 7C, an inter-layer insulating layer 33' is formed for insulating the metal wiring layer 32.

This inter-layer insulating layer 33' is formed in the following manner according to a first embodiment of the present invention. After a first insulating sub-layer is formed by using a BPSG, a PSG layer having a rapid etch speed is deposited thereon. An alternate way is to form the insulating layer 31 by using a BPSG, then form a PSG layer having a rapid etch speed thereon. Thus, during a wet etching, it is arranged so that the etching speed at the surface of the inter-layer insulating layer 33' is faster than that at the boundary of the BPSG, thereby forming a positive slope (as shown in FIGS. 7B and 7C).

A second embodiment of the present invention forms the inter-layer insulating layer 33' by depositing TEOS-USG or P-SiO at a temperature of about 400° C. through a PECVD process. Then, in order to make the surface etching speed faster than the etching speed of the boundary of the BPSG, P ions are ion-implanted with an energy of 80 keV at a concentration of 2E15 atoms/cm$^2$.

In a third embodiment of the present invention, the inter-layer insulating layer 33' is deposited as a thick layer first. It is then etched back by applying a plasma dry etching process to make its thickness to be about 0.2 μm, so that the etching speed at the surface would be faster than that at the boundary of the lower BPSG.

Then, a photoresist is spread on the entire surface and an exposure and development are carried out, thereby forming a photoresist mask 35' for shielding the peripheral circuit and the HCCD portion. Next, a wet etching is carried out on the lower inter-layer insulating layer 33' and the insulating layer 31 by using the photoresist layer 35' as a mask, so that the light receiving portion 10 would be opened. In this way, the portions of the inter-layer insulating layer 33' and the insulating layer 31 which lie on the HCCD-VCCD boundary come to have a positive slope, as shown in FIG. 7C. Consequently, when a light shielding metal layer is deposited, a sufficient step coverage can be ensured.

Figure 8A:
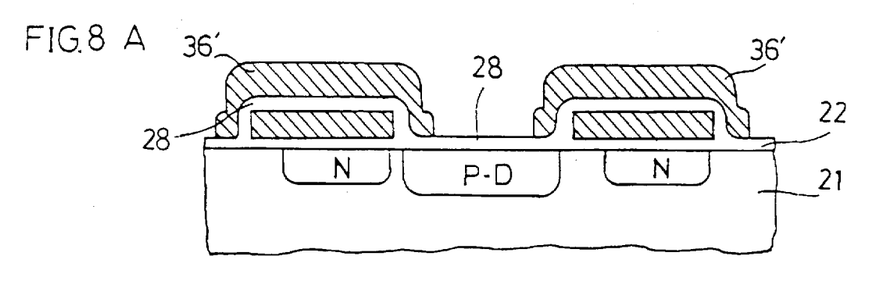
Figure 8B:
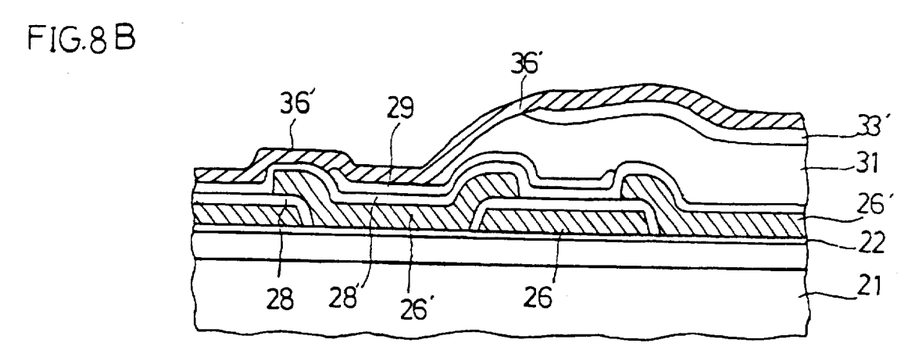

Next, the light shielding metal layer is deposited, and the part of the metal layer corresponding to the photo diode of the light receiving portion is removed to allow light rays to pass through. The rest of the light shielding metal layer 36' remains to block the light rays, thereby forming a light shielding layer 36'. As shown in FIG. 8B, since a positive slope is formed at the BCCD-HCCD boundary, the light shielding layer is uniformly formed to effectively shield light rays.

Accordingly, the present invention provides a method for manufacturing a CCD image pickup device in which the inter-layer insulating layer is made not to be etched in a manner having a negative slope, thereby reducing the noise.

The present invention has the following advantages. First, the pixel portion is formed so that only the oxide layer 28 remains between the light shielding metal layer 36' and the gate electrode 26. Therefore, the stepped difference becomes minimal and the smear can be effectively prevented. Furthermore, when the light shielding metal layer is deposited, a sufficient step coverage is achieved at the HCCD-VCCD boundary. As a result, the conventional phenomenon where light rays are directly introduced through a discontinuity of the metal layer into the CCD channel is prevented. This effectively reduces the noise of the CCD image pickup device.

It will be apparent to those skilled in the art that various modifications and variations can be made in the method for manufacturing a CCD image pickup device of the present invention without departing from the spirit or scope of the invention. Thus, it is intended that the present invention cover the modifications and variations of this invention provided they come within the scope of the appended claims and their equivalents.

What is claimed is:

1. A method for manufacturing a CCD image pickup device, comprising the steps of:

(1) forming a P well and a field oxide layer upon an N type substrate, forming a buried CCD channel, and forming a photo diode;

(2) forming a gate insulating layer and gate electrodes for a vertical CCD (VCCD) and a horizontal CCD (HCCD), and covering the gate electrodes with a cap gate insulating layer;

(3) forming an etch stop layer on the cap gate insulating layer, removing a portion of the etch stop layer corresponding to a contact portion to form a contact hole, depositing a first insulating layer, and etching the first insulating layer and the cap gate insulating layer to open the contact hole to expose the gate electrode;

(4) depositing a metal in the contact hole and carrying out a patterning to form a metal wiring, the metal wiring being connected to the gate electrode;

(5) forming an inter-layer insulating layer on the metal wiring and the first insulating layer;

(6) forming a photoresist mask for covering a peripheral circuit portion and an HCCD portion by applying a photo process, and wet-etching the inter-layer insulating layer and the first insulating layer by using the photoresist mask as a mask to open a light receiving portion; and (7) depositing a light shielding metal layer, removing the light shielding metal layer above a photo diode of a light receiving portion, wherein at the step (5), an etch speed for the inter-layer insulating layer is made to be faster than that for the first insulating layer, resulting in a surface etch speed being faster than an etch speed at a boundary of the first insulating layer, thereby causing a boundary of the inter-layer insulating layer to have a positive slope after the wet-etching of step (6).

2. The method as claimed in claim 1, wherein the first insulating layer is formed by depositing a borophosphosilicate glass (BPSG), and the inter-layer insulating layer is formed by depositing a phosphosilicate glass (PSG), the PSG having an etch speed faster than that of the BPSG.

3. The method as claimed in claim 1, wherein the step (5) of forming the inter-layer insulating layer includes the steps of:

depositing a tetra-ethyl-ortho-silicate undoped silica glass (TEOS-USG) or a P-SiO at a temperature around 400° C. through a plasma enhanced chemical vapor deposition (PECVD) process; and implanting P ions to make the surface etch speed faster than the etch speed at the boundary of the first insulating layer.

4. The method as claimed in claim 1, wherein the step (5) of forming the inter-layer insulating layer includes the steps of:

depositing a phosphosilicate glass (PSC) at a temperature of about 400° C. through a plasma enhanced chemical vapor deposition (PECVD) process; and implanting P ions with an energy of approximately 80 keV at a concentration of approximately 2E15 atoms/cm$^2$ to make the surface etch speed faster than the etch speed at the boundary of the first insulating layer.

5. The method as claimed in claim 1, wherein the step (5) of forming the inter-layer insulating layer includes the steps of:

depositing the inter-layer insulating layer in a thick form; and etching back the inter-layer insulation layer by applying a plasma dry etching process to reduce its thickness to approximately 0.2 μm, so that the surface etch speed is faster than the etch speed at the boundary of the first insulating layer.

6. The method as claimed in claim 1, wherein the etch stop layer includes a silicon nitride layer.

7. A method of manufacturing a CCD image pickup device, comprising the steps of:

forming a structure having a photo diode, a buried CCD channel, and gate electrodes for a vertical CCD (VCCD) and a horizontal CCD (HCCD);

forming a high density insulating layer and a first insulating layer on the structure, the high density insulating layer and the first insulating layer have a contact hole exposing the gate electrode of the VCCD;

forming a metal wiring in the contact hole for connecting with the gate electrode of the VCCD;

forming an inter-layer insulating layer on the first insulating layer and the metal wiring layer, the etch speed of the inter-layer insulating layer being faster than that of the fist insulating layer;

wet etching the inter-layer insulating layer and the first insulating layer by using a mask covering the HCCD and a portion around the metal wiring, thereby forming a light receiving portion, a boundary of the inter-layer insulating layer having a positive slope; and forming a light shielding metal layer on the structure except above the photo diode.

8. The method as claimed in claim 7, wherein the first insulating layer is formed by depositing a borophosphosilicate glass (BPSG), and the inter-layer insulating layer is formed by depositing a phosphosilicate glass (PSG), the PSG having an etch speed faster than that of the BPSG.

9. The method as claimed in claim 7, wherein the step of forming the inter-layer insulating layer includes the steps of:

depositing a tetra-ethyl-ortho-silicate undoped silica glass (TEOS-USG) or a P-SiO at a temperature around 400° C. through a plasma enhanced chemical vapor deposition (PECVD) process; and implanting P ions to make a surface etch speed of the inter-layer insulating layer faster than an etch speed at the boundary of the first insulating layer.

10. The method as claimed in claim 7, wherein the step of forming the inter-layer insulating layer includes the steps of:

depositing a phosphosilieate glass (PSG) at a temperature of about 400° C. through a plasma enhanced chemical vapor deposition (PECVD) process; and implanting P ions with an energy of approximately 80 keV at a concentration of approximately 2E15 atoms/cm$^2$ to make a surface etch speed of the inter-layer insulating layer faster than an etch speed at the boundary of the first insulating layer.

11. The method as claimed in claim 7, wherein the step of forming the inter-layer insulating layer includes the steps of:

depositing the inter-layer insulating layer in a thick form; and etching back the inter-layer insulation layer by applying a plasma dry etching process to reduce its thickness to approximately 0.2 μm, so that a surface etch speed of the inter-layer insulating layer is faster than an etch speed at the boundary of the first insulating layer.

12. The method as claimed in claim 7, wherein the high density insulating layer includes a silicon nitride layer.

* * * * *

UNITED STATES PATENT AND TRADEMARK OFFICE
CERTIFICATE OF CORRECTION

PATENT NO. : 5,679,597
DATED : October 21, 1997
INVENTOR(S) : Shang-Ho Moon

It is certified that error appears in the above-identified patent and that said Letters Patent is hereby corrected as shown below:

Replace the abstract to read as follows:

A method for manufacturing a CCD (charge coupled device) image pickup device includes the steps of: (1) forming a P well and a field oxide layer upon an N type substrate, forming a buried CCD channel, and forming a photo diode; (2) forming a gate insulating layer and gate electrodes for a VCCD and an HCCD, and covering the gate electrodes with a cap gate insulating layer; (3) forming an etch stop layer on the cap gate insulating layer, removing a portion of the etch stop layer corresponding to a contact portion to form a contact hole, depositing a first insulating layer, and etching the first insulating layer and the cap gate insulating layer to open the contact hole to expose the gate electrode; (4) depositing a metal in the contact hole and carrying out a patterning to form a metal wiring, the metal wiring being connected to the gate electrode; (5) forming an inter-layer insulating layer on the metal wiring and the first insulating layer; (6) forming a photoresist mask for covering a peripheral circuit portion and an HCCD portion by applying a photo process, and wet-etching the inter-layer insulating layer and the first insulating layer by using the photoresist mask as a mask to open a light receiving portion; and (7) depositing a light shielding metal layer, removing the light shielding metal layer above a photo diode of a light receiving portion, wherein at the step (5), an etch speed for the inter-layer insulating layer is made to be faster than that for the first insulating layer, resulting a surface etch speed to be faster than an etch speed at a boundary of the first insulating layer, therby causing a boundary of the inter-layer insulating layer to have a positive slope after the wet-etching of step (6).

UNITED STATES PATENT AND TRADEMARK OFFICE
CERTIFICATE OF CORRECTION

PATENT NO. : 5,679,597
DATED : October 21, 1997
INVENTOR(S) : Shang-Ho MOON

It is certified that error appears in the above-identified patent and that said Letters Patent is hereby corrected as shown below:

Column 6, line 39, change "Iayer" to --layer--.
Column 8, line 28, change "2E15" to --$2^{15}$--.

Signed and Sealed this

Fourth Day of May, 1999

Q. TODD DICKINSON

Attest:

Attesting Officer

Acting Commissioner of Patents and Trademarks